United States Patent
Achtenberg et al.

(10) Patent No.: US 9,940,194 B2
(45) Date of Patent: Apr. 10, 2018

(54) ECC DECODING USING RAID-TYPE PARITY

(71) Applicant: SANDISK TECHNOLOGIES LLC, Plano, TX (US)

(72) Inventors: Stella Achtenberg, Netanya (IL); Eran Sharon, Rishon Lezion (IL); Idan Alrod, Herzliya (IL)

(73) Assignee: SanDisk Technologies LLC, Plano, TX (US)

( * ) Notice: Subject to any disclaimer, the term of this patent is extended or adjusted under 35 U.S.C. 154(b) by 12 days.

(21) Appl. No.: 15/177,887

(22) Filed: Jun. 9, 2016

(65) Prior Publication Data

US 2017/0255518 A1    Sep. 7, 2017

Related U.S. Application Data

(60) Provisional application No. 62/303,975, filed on Mar. 4, 2016.

(51) Int. Cl.
*G06F 11/10* (2006.01)
*G06F 3/06* (2006.01)
*H03M 13/11* (2006.01)

(52) U.S. Cl.
CPC ......... *G06F 11/1076* (2013.01); *G06F 3/064* (2013.01); *G06F 3/0619* (2013.01); *G06F 3/0644* (2013.01); *G06F 3/0689* (2013.01); *H03M 13/1102* (2013.01)

(58) Field of Classification Search
CPC .... G06F 11/1076; G06F 11/10; G06F 3/0619; G06F 3/064; G06F 3/0644; G06F 11/1068; G06F 3/0689
See application file for complete search history.

(56) References Cited

U.S. PATENT DOCUMENTS

| | | |
|---|---|---|
| 5,751,733 A | 5/1998 | Glover |
| 5,844,919 A | 12/1998 | Glover et al. |
| 7,823,043 B2 | 10/2010 | Lasser |
| 8,375,274 B1 | 2/2013 | Bonke |
| 8,484,533 B2 | 7/2013 | Olbrich et al. |
| 8,788,910 B1 | 7/2014 | Northcott |
| 2007/0214316 A1 | 9/2007 | Kim |
| 2013/0042053 A1 | 2/2013 | Huang |
| 2014/0281801 A1* | 9/2014 | Meir ................. G06F 11/10 714/763 |
| 2015/0046767 A1 | 2/2015 | Cideciyan et al. |
| 2015/0143027 A1 | 5/2015 | Luo et al. |
| 2015/0205668 A1 | 7/2015 | Sundaram et al. |

(Continued)

*Primary Examiner* — Shelly A Chase
(74) *Attorney, Agent, or Firm* — Toler Law Group, PC (57) ABSTRACT

A device includes a memory and a controller. The controller is configured to read codewords of a data structure from the memory. The codewords include a number of undecodable codewords that are undecodable at an error correction coding (ECC) decoder according to a first correction scheme. The data structure further includes stripe parity corresponding to portions of the codewords encoded according to a stripe correction scheme. The controller is configured, in response to the number of the undecodable codewords exceeding an erasure correction capacity of the stripe correction scheme, to provide information from a stripe decoding operation to an input of a ECC decoding operation corresponding to an undecodable codeword.

20 Claims, 5 Drawing Sheets

500

502
Read codewords of a data structure from the memory, where the codewords include a number of undecodable codewords that are undecodable at an error correction coding (ECC) decoder according to a first correction scheme, the data structure further including stripe parity corresponding to portions of the codewords encoded according to a stripe correction scheme 504
In response to the number of the undecodable codewords exceeding an erasure correction capacity of the stripe correction scheme, providing information from a stripe decoding operation to an input of an ECC decoding operation corresponding to an undecodable codeword (56) References Cited

U.S. PATENT DOCUMENTS

2016/0170832 A1\* 6/2016 Armstrong ............ G06F 3/0619
714/764
2016/0306723 A1\* 10/2016 Lu ....................... G06F 11/2094

\* cited by examiner

ECC DECODING USING RAID-TYPE PARITY

CROSS-REFERENCE TO RELATED APPLICATIONS

The present application claims benefit of U.S. Provisional Application No. 62/303,975, filed Mar. 4, 2016, which is incorporated by reference herein in its entirety.

FIELD OF THE DISCLOSURE

This disclosure is generally related to data storage devices and more particularly to data encoding and recovery in devices with error correction coding (ECC) parity and redundant array of independent disks (RAID)-type parity.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. As more parity bits are used, an error correction capacity of the ECC increases and a number of bits required to store the encoded data also increases. Using a sufficient number of parity bits to provide "worst-case" error correction capability for all data stored in a memory device reduces the storage density of the memory device in order to protect against an amount of data corruption that is statistically unlikely to occur before the memory device reaches the end of its useful life.

SSD devices may also incorporate a redundant array of independent dies (RAID)-type storage scheme that may use parity bits to enable data recovery in case of memory defects and device failures, which cannot be recovered by the ECC which is aimed at handling random errors (e.g., due to program disturb, read disturb, charge loss due to data retention, etc.). ECC may not be able to recover the data in case of memory defects or complete failure, which may result in very high error rates that exceed the ECC capability. Hence, additional RAID-type protection may be required for protecting against such memory defects. For example, a RAID 6 storage scheme may distribute data, a first parity for the data, and a second parity for the data in a "stripe" across multiple non-volatile memories (e.g., across multiple SSDs or across multiple NAND flash memories in a single SSD). The first parity (or the second parity) may enable recovery of the data in the stripe in case of erasures due to failure of one of the data-storing non-volatile memories, and the first parity and the second parity together may enable recovery of the data in the stripe in case of erasures due to failure of two of the data-storing non-volatile memories. However, data in such storage schemes may not be recoverable if three or more of the data-storing non-volatile memories fail. Note that although the name RAID may suggest that RAID parity is stored in a redundant die, this is not mandatory. In some cases, a redundant plane, redundant block or redundant word lines (WLs) or pages within a block may be used for storing the RAID parity. For example, the RAID stripe may be implemented across dies, planes, blocks or pages within a block of the non-volatile memory.

The two protection levels, ECC for random errors and RAID for memory defects and failures, may require memory overprovisioning for storing the ECC and RAID parity.

DETAILED DESCRIPTION

A data storage device is configured to perform error correction code (ECC) and RAID-type decoding. Memory overprovisioning may be used for storing the ECC and RAID parity to provide the two protection levels: ECC for random errors and RAID for memory defects and failures. In order to efficiently utilize the allocated overprovisioning and to improve or maximize the random error correction capability given the overall allocated overprovisioning, joint ECC and RAID decoding can be performed, leveraging the unused RAID overprovisioning for random error correction, whenever there are no memory defects or when the number memory defects is less than the RAID correction capability.

The data storage device may include a controller coupled to a memory. The memory may store a data structure including a plurality of codewords. The data structure may also include parity codewords. Each of the codewords may be stored at separate pages of the memory. The data structure may be configured to enable each of the codewords to be decodable independently of the other codewords. Portions of the codewords may correspond to multiple stripes of the data structure. For example, first portions of the codewords may correspond to a first stripe of the data structure and second portions of the codewords may correspond to a second stripe of the data structure.

The controller may read the codewords from the memory. The codewords may include a number of undecodable codewords that are undecodable at an ECC decoder according to a first correction scheme (e.g., a low-density parity check (LDPC) scheme). The ECC decoder may initiate decoding of the codewords as a single unified codeword by exchanging information between the ECC decoder and a RAID-type decoder.

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

Figure 1:
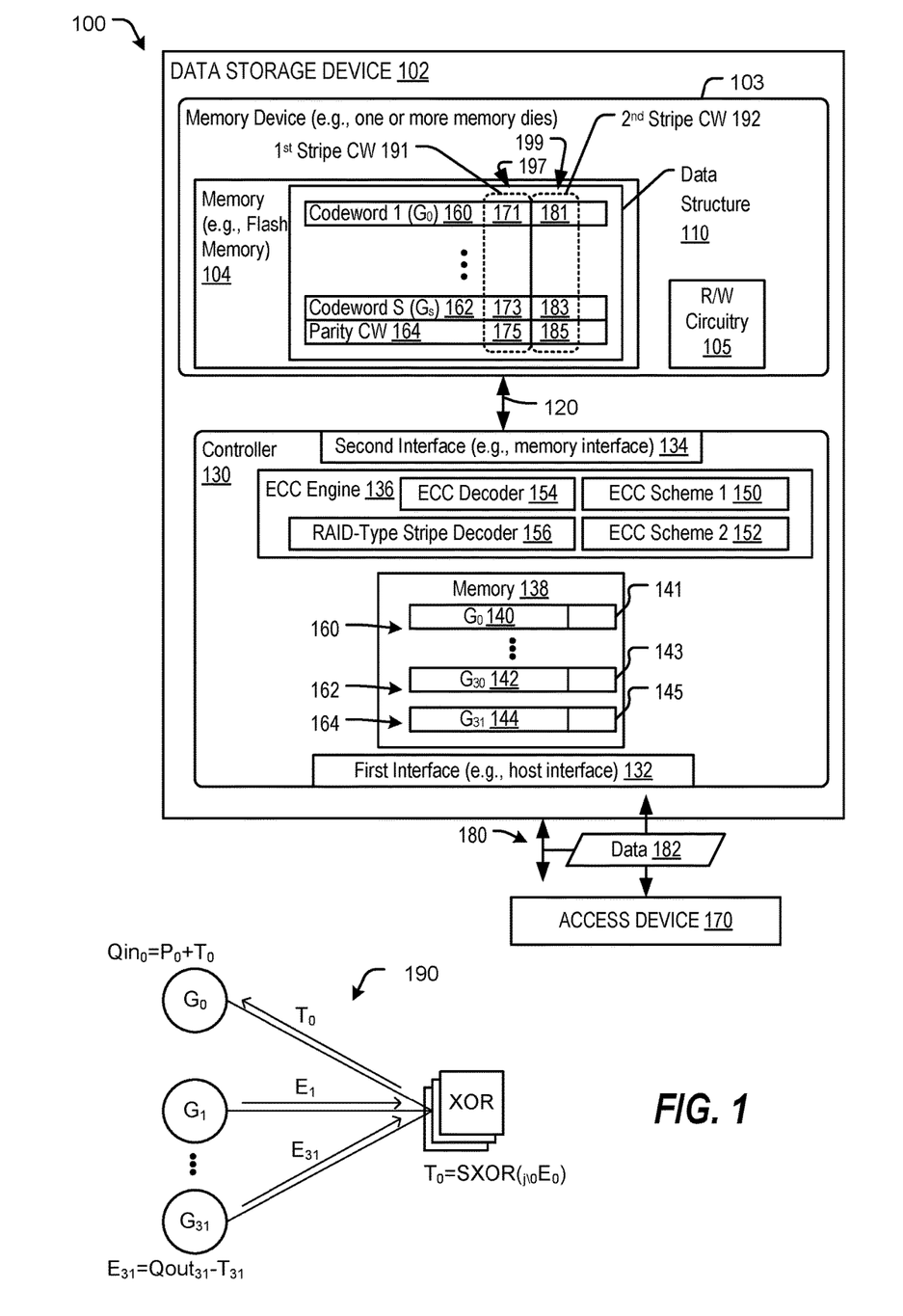
FIG. 1 is a block diagram of an illustrative example of a system including a data storage device including an ECC engine configured to perform ECC decoding that uses RAID-type parity.

FIG. 1 depicts an illustrative example of a system 100 that includes a data storage device 102 and an access device 170 (e.g., a host device or another device). The data storage device 102 includes an ECC engine 136 that is configured to encode stripes of a data structure 110 and to decode data of the data structure 110 according to a first correction scheme 150 (e.g., a LDPC correction scheme) and a second correction scheme 152 (e.g., a stripe correction scheme). If a number of rows (e.g., LDPC codewords) of the data structure 110 that are uncorrectable using the first correction scheme 150 exceeds an erasure correction capability of the stripe correction scheme 152, decoding of the rows as a unified codeword based on iterative information exchange between an ECC decode 154 and a RAID-type stripe decoder 156 may be performed.

The data storage device 102 and the access device 170 may be coupled via a connection (e.g., a communication path 180), such as a bus or a wireless connection. The data storage device 102 may include a first interface 132 (e.g., an access device or host interface) that enables communication via the communication path 180 between the data storage device 102 and the access device 170.

The data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

The data storage device 102 may operate in compliance with an industry specification. For example, the data storage device 102 may include a SSD and may be configured to communicate with the access device 170 using a small computer system interface (SCSI)-type protocol, such as a serial attached SCSI (SAS) protocol. As other examples, the data storage device 102 may be configured to communicate with the access device 170 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 170 may include a memory interface (not shown) and may be configured to communicate with the data storage device 102 via the memory interface to read data from and write data to the memory device 103 of the data storage device 102. For example, the access device 170 may be configured to communicate with the data storage device 102 using a SAS, SATA, or NVMe protocol. As other examples, the access device 170 may operate in compliance with a Joint Electron Devices Engineering Council (JEDEC) industry specification, such as a Universal Flash Storage (UFS) Access Controller Interface specification. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 182, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104. Data striping and error recovery as described with respect to pages of the memory 104 may be extended to include data striping and error recovery across multiple dies, across multiple packages, across multiple memory devices, or any combination thereof.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory 104 includes the data structure 110. The data structure 110 includes multiple codewords (e.g., "S" codewords, where S is an integer greater than one), such as a first codeword ($G_0$) 160 and one or more additional codewords, including an $S^{th}$ codeword ($G_{30}$) 162. Although FIG. 1 depicts an example where S=30, in other implementations S may have any other value. The data structure 110 also includes a parity codeword ($G_{31}$) 164. For example, each of the codewords 160-164 may be stored at separate pages of the memory 104. The data structure 110 is configured to enable each of the codewords 160-164 to be decodable independently of the other codewords 160-164. For example, the first codeword 160 includes parity bits that may be used by the ECC engine 136 to correct bit errors up to the correction capability of the first correction scheme 150. In the event that one or more of the codewords 160-162 contain a number of bit errors that exceeds the correction capability of the first correction scheme 150, the parity codeword 164 may be used to generate error-corrected data corresponding to one or more stripes of the data structure 110, such as a first stripe codeword 191 corresponding to a first stripe 197 and a second stripe codeword 192 corresponding to a $K^{th}$ stripe 199, where K indicates a number of stripes in the data structure 110 and is an integer greater than one.

To illustrate, the first stripe codeword 191 includes a first portion 171 of the first codeword 160 and a first portion of one or more of the other codewords, including a first portion 173 of the $S^{th}$ codeword 162. The first portions 171-173 of the codewords 160-162 may be encoded using a stripe encoding scheme (e.g., an exclusive-or (XOR) scheme) to generate first parity data corresponding to the first stripe 197 that is included in a portion 175 of the parity codeword 164. The second stripe codeword 192 includes a second portion 181 of the first codeword 160 and a second portion of one or more other codewords of the data structure 110, including a second portion 183 of the $S^{th}$ codeword 162. The second stripe codeword 192 also includes a portion 185 of parity data that corresponds to the $K^{th}$ stripe 199 and that is included in the parity codeword 164.

The controller 130 is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The ECC engine 136 is configured to receive data to be stored to the memory 104 and to generate a codeword. For example, the ECC engine 136 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 136 may include one or more decoders configured to decode data read from the memory 104 to detect and correct, up to an error correction capability of the ECC scheme, any bit errors that may be present in the data.

For example, the ECC engine 136 may include a first decoder, such as an ECC decoder 154, to decode codewords (e.g., codewords 160-166) according to the first correction scheme 150. The ECC engine 136 may include a second decoder, such as a RAID-type stripe decoder 156, to correct erasures in the stripe codewords of the data structure 110 (e.g., stripe codewords 191-192) according to the second correction scheme 152. As a non-limiting example, each of the codewords 160-166 may be encoded using a first encoding scheme (e.g., LDPC), each of the stripes 190-192 may be encoded using a second encoding scheme (e.g., XOR), the first correction scheme 150 may include a LDPC correction scheme, and the second correction scheme 152 may include a XOR erasure correction scheme. Although LDPC and XOR are provided as non-limiting examples, each of the codewords 160-166 may be encoded using a different encoding scheme (e.g., a BCH scheme), and each of the stripes 190-192 may be encoded using a different stripe encoding scheme (e.g., a Reed-Solomon or BCH scheme).

The controller 130 is configured to receive the data 182 from the access device 170 and to encode the data 182 into multiple codewords and multiple stripe codewords to generate the data structure 110 to be stored in the memory 104. For example, the controller 130 may be configured to partition the data 182 into S data words. To illustrate, first data 140 may correspond to a first data word of the data 182 and $S^{th}$ data 142 may correspond to a last data word of the data 182. The controller 130 is configured to encode first data 140 to generate a first codeword 160 that is decodable using the first correction scheme 150. To illustrate, the first codeword 160 may include the first data 140 and first parity bits 141 based on the first data 140. The controller 130 is further configured to encode second data 142 (e.g., the $S^{th}$ data) to generate the second codeword 162 (e.g., the $S^{th}$ codeword). The second codeword 162 includes the second data 142 and also includes second parity bits 143 based on the second data 142. Although FIG. 1 illustrates two data words 140 and 142 and two codewords 160 and 162, it should be understood that any number of data words and codewords may be used to generate the data structure 110. For example, S may have a value of 2, 3, 4, 16, 32, 128, or any other integer value greater than one.

The first codeword 160 and the second codeword 162 may be stored in a memory 138 (e.g., a random access memory (RAM) within the controller 130 or RAM (e.g., double data rate type 3 (DDR3) synchronous dynamic RAM (SDRAM)) that is coupled to the controller 130) to enable ECC processing on one or more stripes of the data 140-142 to generate stripe parity data. The controller 130 may be configured to cause the ECC engine 136 to encode multiple stripes of data (e.g., stripes 1 to K (or 0 to K−1), corresponding to multiple columns of multiple bits) from each of the S codewords 160-162 to be encoded using the composite generator function 156 to generate parity bits for each stripe 197-199. The parity bits for each stripe 197-199 are inserted into a set of parity data 144 at locations corresponding to the respective stripes. For example, the controller 130 is configured to generate first parity data that corresponds to the first stripe codeword 191 by encoding the first portions 171-173 of the codewords 160-162. Although FIG. 1 illustrates two stripes 197 and 199, it should be understood that any number of stripes may be used. For example, K may have a value of 2, 3, 4, 16, 32, 128, or any other integer value greater than one.

The ECC engine 136 may encode each stripe until the sets of parity data for each stripe have been generated and stored in the memory 138. The ECC engine 136 is configured to encode the first sets of parity data 144 to generate the first parity codeword 164 that includes the first set of parity data 144 and parity bits 145.

The controller 130 may be configured to transfer the codewords 160-164 from the memory 138 for storage into the memory 104 of the memory device 103 to form the data structure 110 in the memory 104. For example, the controller 130 may be configured to sequentially write the codewords 160-164 to consecutively-addressed pages of the memory 104 so that the data structure 110 is aligned in a row-and-column format as depicted in FIG. 1, with the codewords 160-164 forming rows and the stripes 197-199 forming columns in the memory 104. However, in other implementations, the codewords 160-164 may not have any particular alignment or physical relationship to each other in the memory 104, and locations of each of the codewords 160-164 of the data structure 110 may be tracked and maintained by the controller 130. For example, the controller 130 may include a table (not shown) that indicates the physical addresses of each of the S codewords 160-162 and the parity codewords 164-164. The controller 130 may populate the table when the data structure 110 is stored to the memory 104 and may update the table if any of the codewords 160-164 change physical addresses, such as due to garbage collection, wear leveling, or one or more other maintenance operations. The controller 130 may access the table to retrieve physical addresses of the codewords 160-164 in response to one or more of the codewords 160-162 being undecodable using the first correction scheme 150.

Bit errors occurring in one or more of the codewords 160-162 read from the memory 104 may exceed an error correction capacity of the ECC decoder 154. The ECC engine 136 may read the remaining codewords of the data structure 110 from the memory 104 to the memory 138 and may attempt decoding of the remaining codewords at the ECC decoder 154. If a number of failed codewords (e.g., that are undecodable at the ECC decoder 154 due to too many errors) is less than or equal to an erasure correction capability of the stripe decoder 156, then the stripe decoder 156 may be used to correct each stripe, thereby correcting the failed codewords. However, if the number of failed codewords exceeds the erasure correction capability of the stripe decoder 156, then the ECC engine 136 may perform iterative ECC and RAID decoding on the data structure 110. As an alternative to reading the codewords to the memory 138, an amount of memory (e.g., RAM) that is used may be reduced by reading only a few codewords at a time, or only the codeword that currently being decoded, to the memory 138. For example, each time a codeword is to be processed the codeword may be read again from the memory 104 to the memory 138, and decoding results (but not the codeword itself) may be kept at the memory 138.

The controller 130 may be configured to perform iterative ECC and RAID decoding operations that may be used to enhance the correction capability for random errors occurring in the data structure 110. The iterative ECC and RAID decoding operations may improve correction capability, such as by approximately 50%, by jointly decoding the stripe codewords (e.g., the first stripe codeword 191 and the second stripe codeword 192) and the LDPC codewords (e.g., codeword 160-162) using an iterative information exchange. To illustrate, the controller 130 may be configured to exchange information between the ECC decoder 154 and the RAID-type stripe decoder 156. An example of exchanging information between the ECC decoder 154 and a RAID-type stripe decoder 156 is depicted as graph 190.

Graph 190 depicts sub-graphs corresponding to codewords $G_0, G_1, \ldots, G_{31}$. Each of the sub-graphs for codewords $G_0$-$G_{31}$ corresponds to a bipartite graph that may be used by the ECC decoder 154, such as in a belief-propagation decoding scheme for an LDPC codeword, as illustrated in further detail with reference to FIG. 4. The graph 190 also includes a set of check nodes for the RAID-type stripe decoder 156, illustrated as exclusive-or (XOR) nodes. Message passing may be performed between the RAID-type stripe decoder 156 and the ECC decoder 154, as illustrated in the graph 190. For example, when the codeword represented by the first graph $G_0$ is unable to be corrected by the ECC decoder 154, messages from the remaining graphs $G_1$-$G_{31}$ may be passed to the XOR nodes to generate a message $T_0$ that may be used to update values of the first codeword 160 corresponding to the $G_0$ graph. For example, messages $E_1$-$E_{31}$ may be passed from graphs $G_1$-$G_{31}$. The messages $E_1$-$E_{31}$ may be received at the XOR nodes. The XOR nodes may be used to generate the message $T_0$ to be provided to update values at the graph $G_0$.

For example, the message $E_{31}$ may be equal to the value $Qout_{31}$-$T_{31}$, where $Qout_{31}$ corresponds to an output of the ECC decoder 154, and $T_{31}$ corresponds to an output of the stripe decoder 156. The value $T_0$ may be computed as a soft XOR (SXOR) of the messages $E_1$-$E_{31}$. As illustrated in FIG. 1, the soft XOR of message $E_1$-$E_{31}$ may be designated as SXOR $(_{j\backslash0}E_j)$, and the SXOR for $E_i$ may be given as $\varphi^{-1}(\Sigma_{j\backslash i}\varphi(E_j))$, where $\varphi(x)=\{sign(x), -\log \tanh x/2\}$. In some implementations, a simplified fixed-point implementation may be used for SXOR. For example, when each message $E_1, E_2, E_3$, has a sign bit and a magnitude, the SXOR of $E_1$, $E_2$, and $E_3$ may be represented as $XOR(sign(E_1), sign(E_2), sign(E_3))*min(mag(E_1), mag(E_2), mag(E_3))$. The message $T_0$ may be used to generate an input to the ECC decoder 154 for $G_0$ according to the equation $Qin_0=P_0+T_0$, where P0 corresponds to the value $G_0$ read from the memory 104.

As illustrated in FIG. 1, the codewords $G_0$-$G_{31}$ may be connected by the XOR parity check of the second ECC scheme 152 because $G_0+ \ldots +G_{30}=G_{31}$. The unified codeword $[G_0, \ldots, G_{31}]$ may be very long as compared to the length of each of the codewords $G_0 \ldots G_{31}$. Further, the amount of redundancy of the unified codeword may be equal to a sum of an amount of redundancy for the first ECC scheme 150 and for the second ECC scheme 152. As a result, the correction capability of the large unified code is much higher as compared to the correction capability of the first ECC scheme 150. In other words, the RAID-type coding (e.g., XOR) and the LDPC decoder 154 may exchange information using belief propagation on the large graph illustrated in the example 190. Specific implementations that may be used by the controller 130 are illustrated with respect to FIGS. 2-4.

Figure 2:
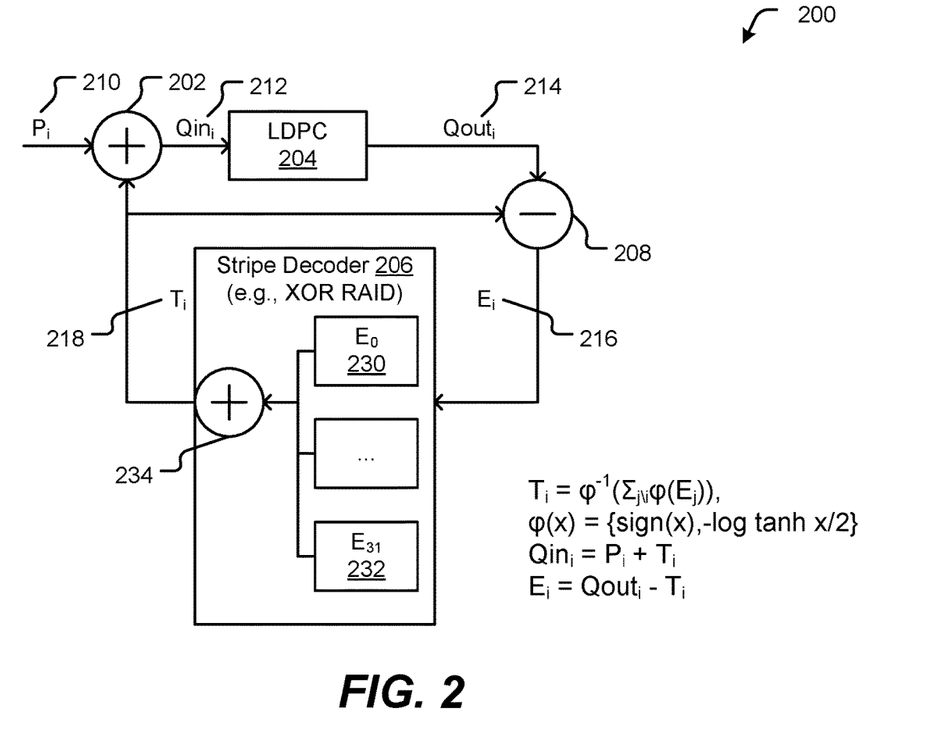
FIG. 2 is a block diagram of a particular example of components that may be included the data storage device of FIG. 1.

Referring to FIG. 2, an example 200 is depicted of a decoding system that may be implemented in the controller 130 of FIG. 1. In the example 200, a combiner 202 has an output coupled to an ECC decoder, such as an LDPC decoder 204. For example, the LDPC decoder 204 may correspond to the ECC decoder 154 of FIG. 1. An output of the LDPC decoder 204 is coupled to a subtractor 208. An output of the subtractor 208 is provided to an input of a stripe decoder 206 (e.g., a XOR RAID decoder), such as the RAID-type stripe decoder 156 of FIG. 1. An output of the stripe decoder 206 is provided as an input to the combiner 202 and is also provided as an input to the subtractor 208.

During operation, codeword information $P_i$ 210 is received at input of the combiner 202. For example, the codeword information $P_i$ 210 may correspond to hard bits and reliability information of the i-th codeword of the data structure 110 of FIG. 1. A message $T_i$ 218 from the stripe decoder 206 is received at a second input of the combiner 202. The combiner 202 is configured to combine the codeword information 212 and the message $T_i$ 218 to generate input data $(Qin_i)$ 212.

The LDPC decoder 204 is configured to receive the input data $Qin_i$ 212 and to perform an LDPC decoding operation in an attempt to correct for errors that may occur in $Qin_i$ 212. An output of the LDPC decoder 204, output data $Qout_i$ 214, is routed to a first input of the subtractor 208, and the message $T_i$ 218 is routed to a subtracting input of the subtractor 208. The subtractor 208 is configured to output a representation $E_i$ 216 of the i-th codeword, as $E_i=Qout_i-T_i$. The representation $E_i$ 216 is provided to the stripe decoder 206 and may be stored in a portion of a memory accessible to the stripe decoder 206, such as the memory 138 of FIG. 1.

The stripe decoder 206 may include (or have access to) storage for representations of each of the codewords $E_0$ 230-$E_{31}$ 232. The stripe decoder 206 may be configured to perform a stripe decoding operation, such as an XOR operation, of the representations of the codewords $E_0$ 230-$E_{31}$ 232, excluding a particular representation of a particular codeword, to generate a reconstructed version of the particular codeword. For example, the stripe decoder 206 may be configured to generate a reconstructed version of the representation $E_0$ by combining representations $E_1, -E_{31}$, via XOR operations, at the combiner 234. An output of the combiner 234 corresponds to the reconstructed version of the particular codeword, (e.g., a reconstructed version of $E_0$ 230) and is illustrated as corresponding to the message $T_i$ 218.

In the example 200, iterative decoding may be performed between the stripe decoder 206 and the LDPC decoder 204. RAID information from the stripe decoder 206 may change extrinsically according to outputs of the LDPC decoder 204. The XOR page that corresponds to the reconstructed version of a particular codeword (e.g., $T_i$) may be updated based on changes to the representations $E_0$ 230-$E_{31}$ 232 and may be fed back to the LDPC decoder 204 as soft information.

The combiner 234 in the stripe decoder 206 may be configured to perform "soft" XOR operations. For example, each of the representations $E_0$ 230-$E_{31}$ 232 may include a multi-bit value for each bit of a codeword. To illustrate, the representation $E_0$ 230 may include, for each bit of the first codeword 160 of FIG. 1, a log-likelihood ratio (LLR) that includes a sign bit indicating a hard bit value and may include additional bits indicating a reliability value associated with the hard bit value. As an example, a six-bit value may be stored for each LLR (e.g., six bits may be stored for each bit of the codeword $G_0$ 160 of FIG. 1). However, in other implementations, a reduced number of bits may be used to store the representations of the codewords $E_0$ 230-$E_{31}$ 232.

For example, memory requirements and computational complexity may be reduced by storing the representations $E_i$ in a compressed format and using low-complexity soft XOR. As a first example, the LLRs received from the subtractor 208 may be quantized into three categories: weak, medium, and strong. Two indicators may be used to indicate the three categories: a first indicator may indicate the weak category, and a second indicator may indicate the medium category. Thus, each bit value of a codeword may be represented in the representations $E_0$ 230-$E_{31}$ 232 by a three-bit value including a first bit for the hard bit, a second bit indicating the weak category, and a third bit indicating the medium category.

As another example, the LLRs may be quantized into two categories: weak and strong. A single counter may be used to store data corresponding to whether a bit has the weak category LLR or the strong category LLR. As a result, each of the $E_i$ representations may use two bits for each bit of the codeword; a first bit indicating a hard bit value and a second bit indicating the weak category or the strong category. In these examples, an amount of memory used for storing the representations $E_0$ 230-$E_{31}$ 232 may be reduced as compared to storing a 6-bit LLR value.

Low-complexity soft XOR may be implemented in conjunction with the 3-bit and 2-bit compressed $E_i$ formats. For example, for the 3-bit format (hard bit, weak LLR indicator bit, medium LLR indicator bit), a first counter may be implemented to count the number of weak LLR indicator bits in a stripe and a second counter may be implemented to count the number of medium LLR indicator bits in the stripe, to determine the smallest magnitude message in the stripe. For the 2-bit format (hard bit, weak/strong LLR indicator bit), a single counter may be implemented to count the number of weak LLR indicators in a stripe to determine the smallest magnitude message in the stripe. A XOR of the hard bits may be used to determine the sign.

Additional simplification may be implemented. For example, for decoded codewords the Ei messages may not be stored and instead only the sign may be stored since the max LLR does not contribute to the SXOR. As another example, the SXOR itself may be stored in a compressed format. Since the stripe decoder calculates the SXOR of all but one codeword, the SXOR of all the codewords may be kept in the memory, and the stripe decoder may instead de-SXOR the relevant currently decoded page. In this manner an amount of memory may be reduced, although rereading and redecoding of the current page may be performed each time the current page is processed. In an "optimal" scheme, since the message passing is extrinsic, the last update may also be saved, so some compressed version of each codeword may be kept in the memory. However, a lower-complexity/reduced memory usage scheme, such as described in further detail with reference to FIGS. 3A-3B, may instead re-read and de-SXOR.

Figure 3A:
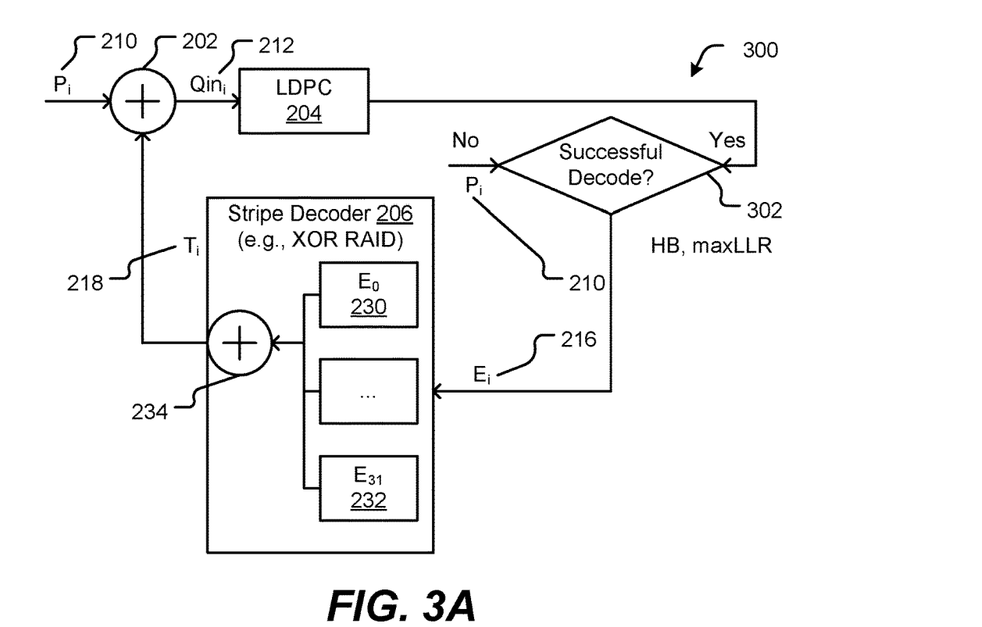
FIG. 3A is a block diagram of another particular example of components that may be included the data storage device of FIG. 1.

FIG. 3A depicts an example 300 of a system that includes components of the system of FIG. 2. In the example 300, a decision 302 replaces the subtractor 208 of FIG. 2. The decision 302 may be represented by circuitry or other logic configured to determine whether the decoding operation at the LDPC decoder 204 was successful. As a result of the decoding operation of the LDPC decoder 204 being successful for a particular codeword (e.g., the i-th codeword), then the output of the LDPC decoder 204 is provided as an input $E_i$ 216 to the stripe decoder 206 for the i-th codeword. The representation $E_i$ 216 may include bit values indicating hard bit values determined by the LDPC decoder 204 and may further include reliability information indicating a maximum reliability that may be represented in the representations of the codewords. The maximum reliability may be set to indicate that the hard bit values are reliable as decoded by the LDPC decoder 204.

In response to the decoding operation at the LDPC decoder 204 not being successful (i.e., at least one bit value of the representation of the codeword output by the LDPC decoder 204 is incorrect), the codeword information $P_i$ 210 is provided as the input $E_i$ 216 to be stored as the representation of codeword i at the stripe decoder 206.

The system of FIG. 3A omits information exchange between the output of the LDPC decoder 204 and the input of the stripe decoder 206 for codewords that are not successfully decoded by the LDPC decoder 204. Codewords that are not successfully decoded upon initial decoding at the LDPC decoder 204 may be iteratively provided to the combiner 202 for repeated attempts at decoding at the LDPC decoder 204 using the codeword information $P_i$ 210 (e.g., full or quantized LLRs received from the memory 104) and updated soft XOR information from the stripe decoder 206 (e.g., quantized LLR) to generate the input data $Qin_i$ 212. Once one of the undecodable codewords is successfully decoded at the LDPC decoder 204, that codeword's representation at the stripe decoder 206 is updated and the reliability of subsequent reconstructed versions of the remaining undecoded codewords is increased. However, if none of the undecoded codewords are decoded, the decoding process may end and the system 300 may generate an uncorrectable error indication.

The controller 130 of FIG. 1 may implement the system of FIG. 3A using a lookup table that indicates a mapping of the output of the stripe decoder 206 (e.g., a "XOR" page representing a reconstructed version of a particular codeword) to a soft bit value that may be used in the message $T_i$ 218. For example, the lookup table may correspond to an LLR table that indicates reliabilities based on a number of undecoded codewords of the data structure 110. For example, the greater number of codewords that remain undecoded in the data structure 110, the less reliable the output of the stripe decoder 206 is. To illustrate, the BER of the XOR page generated at the stripe decoder 206 may be denoted as $BER_{XOR}=\frac{1}{2}\cdot(1-(1-2\cdot BER)^{t-1})\approx(t-1)\cdot BER$, and LLR may be calculated based on $BER_{XOR}$. The LLR represented by the message $T_i$ or by soft bits of the message $T_i$ may therefore be adjusted to improve an inaccuracy of the input data $Qin_i$ 212. By improving the accuracy of the input data $Qin_i$ 212, the LDPC decoder 204 may have an increased chance of a successful coding operation.

As an example, the codeword information $P_i$ 210 may include, for each bit of the codeword, a first bit indicating a hard bit value and a second bit indicating a soft bit value (e.g., based on a soft bit reading from the memory 104 of FIG. 1). The output of the stripe decoder 206 may be provided directly as a second soft bit page without translation by an LLR lookup table. Alternatively, the output of the stripe decoder 206 may be modified based on a lookup operation at an LLR table, and the output of the lookup operation may be used as a second soft bit page of the input data $Qin_i$ 212. As an example, three LLR tables may be used for different cases of the number of LDPC failures in the data structure 110, indicating different magnitudes of LLRs that are to be assigned to the resulting XOR pages output by the stripe decoder 206.

Figure 3B:
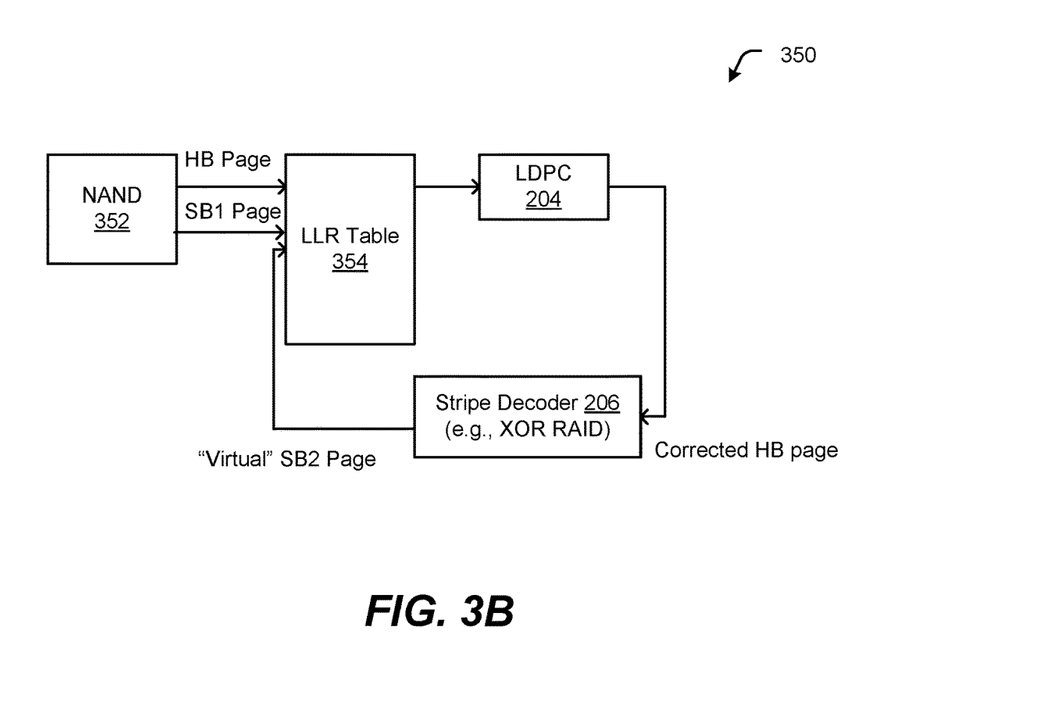
FIG. 3B is a block diagram of another particular example of components that may be included the data storage device of FIG. 1.

In an illustrative implementation depicted in an example 350 in FIG. 3B, a LLR table 354 may be used in place of the combiner 202 of FIG. 2 and/or FIG. 3A. The LLR table 354 may receive a HB page and a SB page corresponding to $P_i$ from the memory 104, such as a NAND flash memory 352 (e.g., a hard bit (HB) page and a first soft bit page (SB1). The LLR table 354 may also receive a "virtual" second soft bit page (SB2) as the output of the stripe decoder 206. The LLR table 354 may output a value of $Qin_i$ based on the inputs HB, SB, and SB2. Because the LLR table 354 receives multiple inputs (e.g., the output of the stripe decoder 206 and $P_i$ from the memory 104), the LLR table 354 may function to provide quantization to the input of the LDPC decoder 204.

Figure 4:
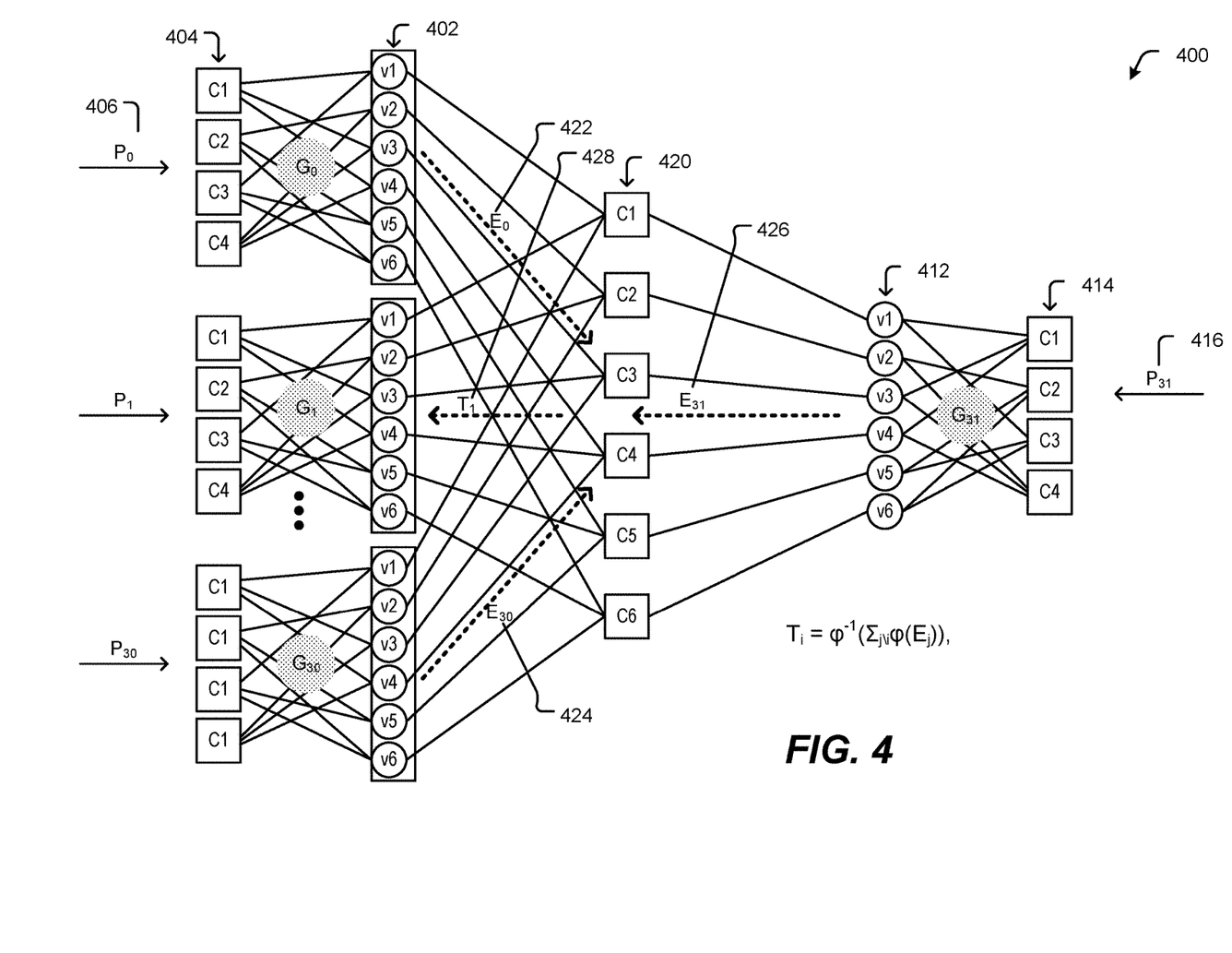
FIG. 4 is a diagram of a particular example of a unified graph that includes ECC codewords connected by RAID-type check nodes that may be included in the data storage device of FIG. 1.

FIG. 4 depicts an example 400 of the unified graph 190 of FIG. 1. In the example 400, a first graph $G_0$ corresponds to the first codeword $G_0$ 160 and illustrates a set of six variable nodes (v1, v2, v3, v4, v5, v6) 402. The variable nodes 402 are coupled to check nodes 404, labeled C1, C2, C3 and C4. The graph $G_0$ is populated based on the codeword information $P_0$ 406, such as hard bit and soft bit data received from the memory device 103 upon reading the first codeword 160. The unified graph also includes multiple other graphs, including graphs $G_1$-$G_{31}$. The graph $G_{31}$ includes a set of variable nodes 412 and a set of check nodes 414, and is populated based on codeword information $P_{31}$ 416, which may include the parity codeword 164 including parity data for each of the stripes 191-192 of the data structure 110. The variable nodes of each of the graphs $G_0$-$G_{31}$ are coupled to corresponding check nodes 420, indicating the exclusive OR check of the second scheme 152.

Message passing may be performed for decoding of each undecodable codeword. For example, when the codeword $P_1$ is undecodable at the ECC decoder 154 of FIG. 1, the messages $E_0$ 422, $E_2$, $E_3$, ... $E_{30}$ 424, and $E_{31}$ 426 may be generated and combined via the check nodes 420 to generate the message $T_1$ 428. The message $T_1$ 428 may be applied to the codeword information $P_1$, such as described with respect to the combiner 202 of FIGS. 2-3A or the LLR table 354 of FIG. 3B. To illustrate, the message $T_1$ 428 may provide a sufficient modification of the codeword information $P_1$ to enable the ECC decoder 154 to successfully decode the input data corresponding to $P_1$. In this manner, each of the unsuccessfully decoded codewords corresponding to the graphs $G_0$-$G_{31}$ may be modified using the messages T and decoding may be iteratively retried until all undecoded codewords have been processed. A next iteration of decoding may begin with the codewords that remain undecoded, and processing may continue until all codewords have been decoded, a particular codeword of interest has been decoded, or a number of decoding iterations has exceeded a decoding iteration threshold.

For example, for each codeword i decoding failure, the following equations may be applied.

$$T_i = \varphi^{-1}\left(\sum_{j \ne i} \varphi(E_j)\right) \qquad \text{Equation 1}$$

$$\varphi(x) = \left\{\text{sign }(x), -\log\tanh\frac{x}{2}\right\} \qquad \text{Equation 2}$$

$$Qin_i = P_i + T_i \qquad \text{Equation 3}$$

$$E_i = Qout_i - T_i \qquad \text{Equation 4}$$

By combining the LDPC codewords and the RAID-type stripe codewords and their respective parities into a unified graph as depicted in FIG. 4, an ECC correction capability of information in the data structure 110 may be enhanced due to a larger percentage of parity and also due to a much increased codeword length, which increases the codeword correction efficiency.

Figure 5:
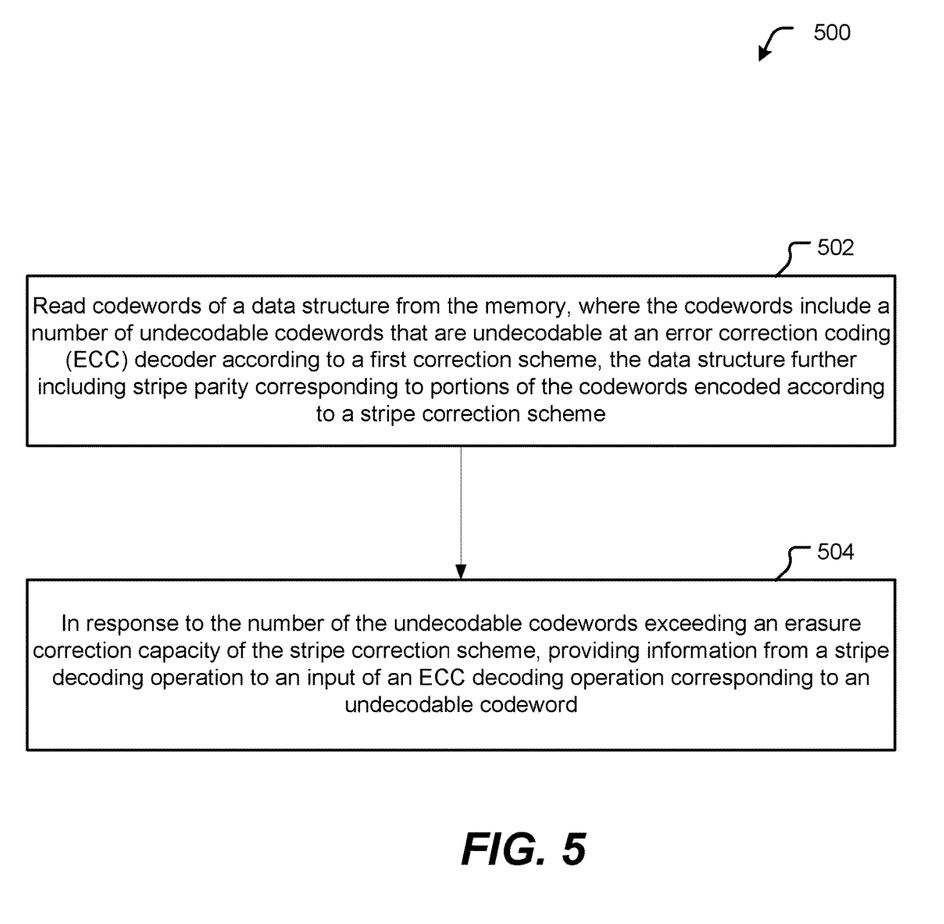
FIG. 5 is a flow diagram of a particular example of a method of decoding data that may be performed by the data storage device of FIG. 1.

Referring to FIG. 5, a particular illustrative example of a method of decoding data is depicted and generally designated 500. The method 500 may be performed at a data storage device, such as at the data storage device 102 of FIG. 1. One or more operations of the method 500 may be performed or initiated by the controller 130, such as at the ECC engine 136 of FIG. 1.

The method 500 includes reading codewords of a data structure from the memory, where the codewords include a number of undecodable codewords that are undecodable at an error correction coding (ECC) decoder according to a first correction scheme, the data structure further including stripe parity corresponding to portions of the codewords encoded according to a stripe correction scheme, at 502.

The method 500 also includes in response to the number of the undecodable codewords exceeding an erasure correction capacity of the stripe correction scheme, providing information from a stripe decoding operation to an input of an ECC decoding operation corresponding to an undecodable codeword, at 504.

The controller may perform the stripe decoding operation to generate a reconstructed version of the undecodable codeword, such as an output of the stripe decoder 206. The information provided from the stripe decoding operation may includes soft bits based on bit values of the reconstructed version of the undecodable codeword. The information may be generated by accessing a lookup table to access soft bit values corresponding to exclusive-OR values.

In a particular implementation, the stripe correction scheme corresponds to a redundant array of independent disks (RAID)-type exclusive-OR (XOR) scheme, and the first correction scheme corresponds to a low density parity check (LDPC) scheme. The method 500 may also include decoding using belief propagation message-passing between the ECC decoder and a XOR stripe decoder.

The method 500 may also include updating a stored representation of each particular codeword after processing the particular codeword at the ECC decoder. For example, each representation may include data corresponding to log-likelihood ratios (LLRs). The LLRs from the codewords other than a particular codeword may be combined to generate particular information of the particular codeword from the stripe decoding operation. The particular information may be added to the particular codeword as an input to the ECC decoder, such as via the combiner 202. The particular information may also be subtracted from an output of the ECC decoder to generate the representation of the particular codeword in response to the ECC decoder failing to decode the input, such as via the subtractor 208.

In another particular implementation, such as depicted in FIGS. 3A and 3B, the representation of the particular codeword may be retained in response to the ECC decoder failing to decode the input. Alternatively, the representation of the particular codeword may be replaced with hard bits output from the ECC decoder with indications of high reliability in response to the ECC decoder decoding the input.

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations of the methods 200-400. In a particular embodiment, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

To further illustrate, the data storage device 102 may be configured to be coupled to the access device 170 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 170) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
a memory; and
a controller configured to read codewords of a data structure from the memory, wherein the codewords include a number of undecodable codewords that are undecodable at an error correction coding (ECC) decoder according to a first correction scheme, the data structure further including stripe parity corresponding to portions of the codewords encoded according to a stripe correction scheme, wherein the controller is further configured, in response to the number of the undecodable codewords exceeding an erasure correction capacity of the stripe correction scheme, to provide information including soft bits from a stripe decoding operation to an input of a ECC decoding operation corresponding to an undecodable codeword, the soft bits based on bit values of a reconstructed version of the undecodable codeword.

2. The device of claim 1, wherein the controller is configured to perform the stripe decoding operation to generate the reconstructed version of the undecodable codeword.

3. The device of claim 2, wherein the controller is configured to generate the information by accessing a lookup table to access soft bit values corresponding to exclusive-OR values.

4. The device of claim 1, wherein the stripe correction scheme corresponds to a redundant array of independent disks (RAID)-type exclusive-OR (XOR) scheme and wherein the first correction scheme corresponds to a low density parity check (LDPC) scheme.

5. The device of claim 4, wherein the controller is configured to perform decoding using belief propagation message-passing between the ECC decoder and a XOR stripe decoder.

6. The device of claim 1, further comprising a memory configured to store representations of each of the codewords, and wherein the controller is configured to update the stored representation of each particular codeword after processing the particular codeword at the ECC decoder.

7. The device of claim 6, wherein each representation includes data corresponding to log-likelihood ratios (LLRs), wherein the controller is configured to combine the LLRs from the codewords other than a particular codeword to generate particular information of the particular codeword from the stripe decoding operation, wherein the controller is configured to add the particular information to the particular codeword as an input to the ECC decoder.

8. The device of claim 7, wherein the controller is configured to subtract the particular information from an output of the ECC decoder to generate the representation of the particular codeword in response to the ECC decoder failing to decode the input.

9. The device of claim 7, wherein the controller is configured to retain the representation of the particular codeword in response to the ECC decoder failing to decode the input and to replace the representation of the particular codeword with hard bits output from the ECC decoder with indications of high reliability in response to the ECC decoder decoding the input.

10. The device of claim 7, wherein the data corresponding to the LLRs includes a hard bit and a 2-bit reliability value.

11. The device of claim 7, wherein the data corresponding to the LLRs includes a hard bit and a 1-bit reliability value.

12. A method comprising:
in a data storage device that includes a controller and a memory, performing:
reading codewords of a data structure from the memory, wherein the codewords include a number of undecodable codewords that are undecodable at an error correction coding (ECC) decoder according to a first correction scheme, the data structure further including stripe parity corresponding to portions of the codewords encoded according to a stripe correction scheme;
in response to the number of the undecodable codewords exceeding an erasure correction capacity of the stripe correction scheme, providing information from a stripe decoding operation to an input of an ECC decoding operation corresponding to an undecodable codeword; and
decoding using belief propagation message-passing between the ECC decoder and an exclusive-OR (XOR) stripe decoder.

13. The method of claim 12, wherein the controller performs the stripe decoding operation to generate a reconstructed version of the undecodable codeword, and wherein the information includes soft bits based on bit values of the reconstructed version of the undecodable codeword.

14. The method of claim 13, further comprising generating the information by accessing a lookup table to access soft bit values corresponding to exclusive-OR values.

15. The method of claim 12, wherein the stripe correction scheme corresponds to a redundant array of independent disks (RAID)-type exclusive-OR (XOR) scheme and wherein the first correction scheme corresponds to a low density parity check (LDPC) scheme.

16. The method of claim 12, further comprising updating stored representation of each particular codeword after processing the particular codeword at the ECC decoder.

17. The method of claim 16, wherein each representation includes data corresponding to log-likelihood ratios (LLRs), and further comprising:
combining the LLRs from the codewords other than a particular codeword to generate particular information of the particular codeword from the stripe decoding operation; and
adding the particular information to the particular codeword as an input to the ECC decoder.

18. The method of claim 17, further comprising subtracting the particular information from an output of the ECC decoder to generate the representation of the particular codeword in response to the ECC decoder failing to decode the input.

19. The method of claim 17, further comprising:
retaining the representation of the particular codeword in response to the ECC decoder failing to decode the input; or
replacing the representation of the particular codeword with hard bits output from the ECC decoder with indications of high reliability in response to the ECC decoder decoding the input.

20. A device comprising:
a memory device; and
a controller configured to:
read codewords of a data structure from the memory device, wherein the codewords include a number of undecodable codewords that are undecodable at an error correction coding (ECC) decoder according to a first correction scheme, the data structure further including stripe parity corresponding to portions of the codewords encoded according to a stripe correction scheme;
in response to the number of the undecodable codewords exceeding an erasure correction capacity of the stripe correction scheme, provide information from a stripe decoding operation to an input of a ECC decoding operation corresponding to an undecodable codeword; and
update a stored representation of each particular codeword after processing the particular codeword at the ECC decoder.

* * * * *